(12) United States Patent
Hartig

(10) Patent No.: US 7,166,199 B2
(45) Date of Patent: Jan. 23, 2007

(54) MAGNETRON SPUTTERING SYSTEMS INCLUDING ANODIC GAS DISTRIBUTION SYSTEMS

(75) Inventor: Klaus Hartig, Avcoa, WI (US)

(73) Assignee: Cardinal CG Company, Eden Prairie, MN (US)

( * ) Notice: Subject to any disclaimer, the term of this patent is extended or adjusted under 35 U.S.C. 154(b) by 224 days.

(21) Appl. No.: 10/323,703

(22) Filed: Dec. 18, 2002

(65) Prior Publication Data

US 2004/0118678 A1    Jun. 24, 2004

(51) Int. Cl.
C23C 14/35 (2006.01)
(52) U.S. Cl. .......................... 204/192.12; 204/298.07; 204/298.08; 204/298.14; 204/298.19; 204/298.2; 204/298.21; 204/298.22
(58) Field of Classification Search .......... 204/192.12, 204/298.07, 298.08, 298.14, 298.19, 298.2, 204/298.21, 298.22
See application file for complete search history.

(56) References Cited

U.S. PATENT DOCUMENTS

| | | | |
|---|---|---|---|
| 3,830,721 A | 8/1974 | Gruen et al. | 204/298.07 |
| 4,802,968 A | 2/1989 | Hendrix et al. | 204/298.12 |
| 4,849,087 A | 7/1989 | Meyer | 204/298 |
| 4,946,576 A | 8/1990 | Dietrich et al. | 204/290.06 |
| 5,039,376 A | 8/1991 | Zukotynski et al. | 216/71 |
| 5,108,574 A | 4/1992 | Kirs et al. | 204/298.22 |
| 5,223,111 A | 6/1993 | Lueft | 204/298.07 |
| 5,322,605 A | 6/1994 | Yamanishi | 204/298.07 |
| 5,334,302 A | 8/1994 | Kubo et al. | 204/298.18 |
| 5,384,021 A | 1/1995 | Thwaites | 204/298.21 |
| 5,403,458 A | 4/1995 | Hartig et al. | 204/192.15 |
| 5,616,225 A | 4/1997 | Sieck et al. | 204/298.14 |
| 5,662,784 A | 9/1997 | Schuhmacher et al. | 204/298.07 |
| 5,733,418 A | 3/1998 | Hershcovitch et al. | 204/192.11 |
| 5,747,362 A | 5/1998 | Visser | 438/758 |
| 5,855,745 A | 1/1999 | Manley | 204/192.12 |
| 6,458,253 B1 * | 10/2002 | Ando et al. | 204/192.15 |

FOREIGN PATENT DOCUMENTS

| | | |
|---|---|---|
| EP | 0413 291 | 2/1991 |
| EP | 0 674 337 | 9/1995 |
| WO | WO 99/65057 | 12/1999 |

OTHER PUBLICATIONS

McClenahan et al., "Production of Thin Film by Controlled Deposition of Sputtered Materials" Topics in Applied Physics 64, pp. 338-377, 1991.

* cited by examiner

*Primary Examiner*—Rodney G. McDonald
(74) *Attorney, Agent, or Firm*—Fredrikson & Byron, P.A.

(57) ABSTRACT

The present invention provides a magnetron sputtering system using a gas distribution system which also serves as a source of anodic charge to generate plasma field. The sputtering system is comprised of a vacuum chamber, a cathode target of sputterable material, a power source which supplies positive and negative charge, and a gas distribution system. The gas distribution system may comprise a simple perforated gas delivery member, or it may comprise a perforated gas delivery member with an attached conductive anodic surface. The gas delivery member may also contain an inner conduit with further perforations which serves to baffle flow of the sputtering gas. Gas flow may be regulated within discrete portions of the gas distribution system. The anodic surfaces of the gas distribution system are cleaned through the action of plasma and gas flow, creating a more stable plasma and reducing the need for maintenance.

49 Claims, 6 Drawing Sheets

MAGNETRON SPUTTERING SYSTEMS INCLUDING ANODIC GAS DISTRIBUTION SYSTEMS

FIELD OF THE INVENTION

The present invention relates to apparatus, systems, and methods utilized for the controlled deposition of thin films of sputtering material on substrates. More specifically, the present invention provides for magnetron sputtering systems that comprise a gas distribution system including one or more conductive anodic surfaces.

BACKGROUND OF THE INVENTION

In the coated glass industry it is desirable to apply one or more thin layers of coating materials to one or both surfaces of the glass to provide desired characteristics to the finished coated glass product. For example, in the manufacturing of glass for a variety of applications, it is often desirable to apply infrared reflective coatings and/or other multilayer coating systems to provide desirable characteristics related to transmittance, emissivity, reflectivity, durability, color, photocatalysis and chemical resistance.

Presently, the controlled sputter deposition of coating materials is the most effective method of forming thin films on solid substrates. Compared with other thin-film formation methods such as vacuum evaporation, electroplating, electroless plating, and chemical vapor deposition, sputter deposition allows for a greater choice of film materials, higher purity and controlled composition of the film, greater adhesive strength and homogeneity of the film, and greater control of the film thickness.

Planar and cylindrical magnetrons are widely used for sputtering deposition of films on substrates. The substrate is positioned within a vacuum chamber containing at least one rotating cylindrical target or planar target that is comprised of or includes sputtering material on its outer surface. Sputtering occurs when energetic ionized particles impinge on the surface of a the target, causing the emission of particles, and typically erosion of the surface. Generally, the sputter coating process can continue until the cathode target is exhausted.

To achieve the sputtering process an electrical field is created between a cathode target and an anode in a vacuum chamber. Next, a gas, typically an inert gas such as argon, is introduced to the vacuum chamber. Electrons in the electrical field are accelerated and gain enough energy to ionize the gas atoms and create a glow discharge plasma. The resulting plasma is then attracted to the target, bombarding it and liberating target surface atoms. The charged plasma is maintained in a relatively narrowly defined area in front of the target by a magnetic field. As previously suggested, the target functions as the cathode in the sputtering system and a separate anode is provided in the chamber at a location spaced away from the target. Commonly, the chamber walls, a separate bar or another conductive member positioned away from the target functions as the anode.

To keep the plasma discharge active and local to the cathode target, it is necessary for the chamber to have a stable field enveloping the plasma and the cathode target. Typically, this is performed with permanent magnets, located behind or within the target, which confine electrons generated by a negative voltage close to the target surface thus keeping the plasma localized to the target surface. The magnets are usually of a permanent magnet type, arranged uniformly behind a planar target or arranged along a line within the rotating cylindrical target and held from rotation with the cylindrical target. The sputtering zone is created by the magnets extending along substantially the entire length and width of the planar sputtering target or extending along the length of the cylindrical sputtering target and only a small circumferential (radial) difference around it. Traditionally, the magnets are arranged so that the sputtering zone exists at the bottom of the planar or cylindrical target, facing a substrate being coated directly beneath.

Sputtering may be conducted in the presence of one or more gases. A first inert gas, such as argon, is commonly utilized for the production of the glow discharge plasma in a sputtering system. Additional gases may be supplied to the sputtering system if desired, such as one or more reactive gases. When conducted in the presence of a reactive gas such as oxygen or nitrogen, a reactive product of the coating material is deposited on the substrate, i.e., the coating layer is the product of the coating material and the reactive gas. For example, the introduction of a reactive gas such as oxygen or nitrogen to the chamber forms an oxide or nitride with the liberated target atoms.

A problem with many previous sputtering systems is that during the sputter coating process, liberated particles of coating material are deposited on non-substrate exposed surfaces within the vacuum chamber, such as the chamber walls and other mechanisms within the chamber including the one or more anodes. Over time, a layer of the target material or rejected target material will tend to accrete on the outer surface of the anode. The rate at which this accumulation occurs will vary depending on the power applied and the material of which the target is formed. While this accumulation is not desirable in the sputtering process for any targets, a coating of a conductive material generally does not unduly hamper performance of the sputtering system. However, if the material deposited on the anode is an insulator or dielectric material, this creates significant problems. For example, when a dielectric material such as zinc is sputtered in an oxidizing atmosphere to deposit zinc oxide, a coating of zinc oxide will be deposited on the anode, which reduces the effectiveness of the sputtering process. Since many coating materials or their reactive products are insulators, semiconductors, or are otherwise substantially electrically nonconductive materials (such as $Al_2O_3$, $SiO_2$, $Si_3N_4$, $TiO_2$), accumulation of these nonconductive materials on the anode causes a progressive slowing of the coating process, which ultimately results in the process shutting down. A nonconductive or dielectric material coating on the anode inhibits and eventually prevents charge carriers from flowing from the anode to the cathode, thus first reducing and eventually, in effect, stopping the sputtering process.

Similarly, undesirable coating of the gas distribution system positioned within the vacuum chamber may also cause problems related to adequate sputtering of coating material. For example, undesirable coating of the gas delivery members positioned in the vacuum chamber can cause insufficient reaction between the coating materials and the reactive gases, if a reactive gas is delivered through such members, or can inhibit the creation of plasma by limiting the amount of gas delivered to the chamber. Therefore, the result of coating build up on the gas distribution system may create overly metallic films or cause a slowing of the system due to insufficient plasma generation.

The sputtering zone also becomes difficult to control and maintain when the immediate area surrounding the cathode becomes coated with sputtering material. As this happens the charged plasma on the surface of the cathode is repulsed from the built up sputtering coating on the internal surfaces of the chamber due to their like polarity. As the repulsion of the plasma increases, the charged plasma expands outward away from the cathode in "search" of a conductive outlet. As the conductive areas of the chamber become randomly distributed and located further and further away from the plasma and the cathode, the uniformity of the plasma discharge deteriorates over time, thereby slowing the sputtering process. Eventually, the sputtering process needs to be stopped for cleaning. Furthermore, the non-uniformity of the plasma discharge typically reduces the quality of the thin film on the substrate.

Manufacturers will often try to stretch the chamber's productive operating period. This can be risky since near the end of a productive operating period the plasma discharge may be searching for non-coated areas in the chamber. To keep the plasma discharge active, manufacturers sometimes inject extra gas through the gas distribution system and into the chamber to create a non-insulated area. This extra gas can create a nucleation curtain or a clustering of the sputtered material. As a result, electrical current may be directed to flow through the nucleation curtain into the gas distribution system, seeking a path back to the power supply. This improper flow of electric current can cause the gas pipe to meltdown.

In addition to process downtime, the accumulation of electrically nonconductive or dielectric coatings on the anode of a sputter coating device may have other adverse effects on the coating process and the coating formed on the substrate. Nonuniformities may occur in the coating due to changes in the size of the conductive area of the anode. Moreover, the accumulation of electrically nonconductive material on the anode may contribute to arcing, thereby causing large pieces of coating material to drop off the cathode target or other coated positions within the chamber and onto the substrate. Furthermore, thick accumulation of a substantially nonconductive coating on the anode results in poor adhesion of the coating to the anode. As a result, flakes or pieces of material may fall off the anode and onto the substrate, thereby contaminating the coated surface. All of these adverse effects result in a nonuniform coating on the substrate to be coated.

These coating nonuniformities, as well as the accumulation of nonconductive material on the anode necessitate interrupting the coating process in order to clean or change the anode. This involves venting the chamber, careful cleaning, and reevacuating the chamber. Such nonuniformities and accumulation often occur at levels sufficient to require the user to frequently stop the process in order to reconditioning the anode. One conventional technique requires that production be shut down for as much as 6–8 minutes every hour so that the relative polarity of the cathode and anode can be reversed to sputter the accreted material off the anode surface. Other manual cleaning techniques, such as sandblasting the interior of the chamber may be utilized to reduce the accumulation of stray coating material. Cleaning the chamber can reduce production time and be very expensive.

Therefore, it would be beneficial to provide a sputtering apparatus comprised of a gas distribution system which contains one or more conducting anodic surfaces positioned in sufficient proximity to the cathodically charged target to maintain stable plasma distribution. Furthermore it would be desirable for a sputtering apparatus to provide the following features and/or benefits: a more constant and uniform depletion of the target; a more uniform coating process; a reduction in product variance by avoiding the problems associated with the accumulation of nonconductive material on anodic surfaces within the sputtering chamber; an improved sputtering system when the material being sputtered is a dielectric material; a number of spaced apart gas distribution nozzles as a series of separate anodes, thus permitting the size, shape, and position of the plasma to be easily controlled; a significant reduction in the slowing of the anode coating process over time; a significant reduction of the chamber becoming coated with insulating material; and, to reduce the need to stop the sputtering process for cleaning.

SUMMARY OF THE INVENTION

The present invention provides a magnetron sputtering system including a gas distribution system which contains one or more anodic surfaces positioned in sufficient proximity to the cathodically charged target to create a plasma. Generally, the sputtering system is comprised of a vacuum chamber defining a controlled environment; a cathode assembly including a target having one or more sputterable target materials; one or more power sources supplying a cathodic charge and an anodic charge; and a gas distribution system. In various embodiments of the present invention, the gas distribution system is comprised of one or more gas delivery members through which one or more gases are introduced into the deposition chamber. The gas delivery members may be operatively connected to a positive charge, or adjoined or in sufficient proximity to a positively charged anodic member. The distribution system is generally placed in sufficient proximity to and at a uniform distance from the cathode assembly to create a stable plasma. Preferably, the gas distribution system is maintained at a relatively positive state compared to the cathode assembly, providing the electrical potential necessary to maintain sputtering. The sputtering apparatus maintains a stable plasma at the exterior surface of the cathode assembly. The flow of sputtering gas through the gas delivery member maintains the anode in an exposed, electrically conductive state during prolonged sputtering of the target.

DETAILED DESCRIPTION

Figure 1:
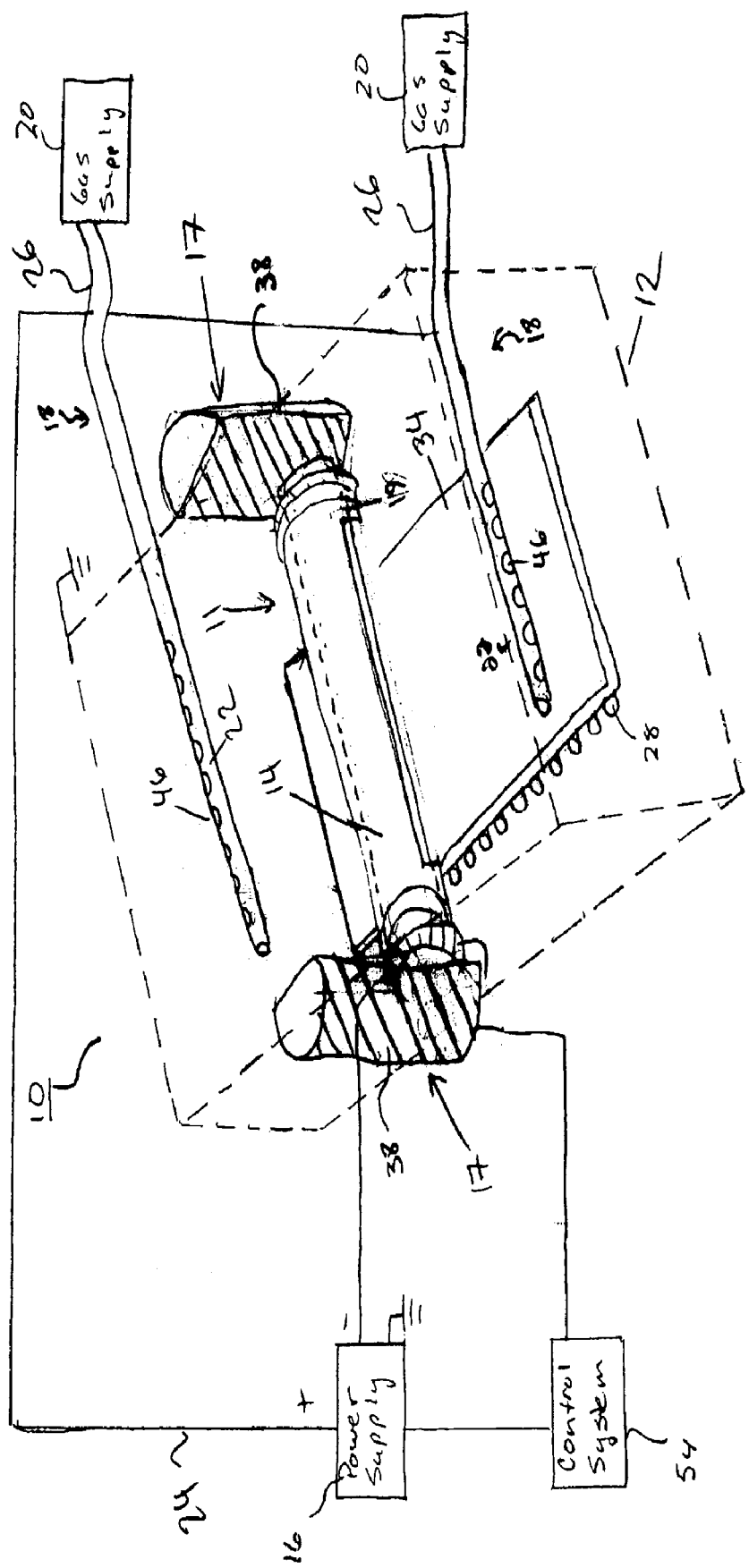
FIG. 1 is a schematic drawing depicting a magnetron sputtering system including an anodic gas distribution system in accordance with an embodiment of the present invention.

To assist in an understanding of the invention the preferred embodiments will now be described in detail. Reference will frequently be made to the drawings, which are summarized above. Reference numerals will be used to indicate certain parts and locations in the drawings. The same reference numerals will be used to indicate the same parts or locations throughout the drawings unless otherwise indicated.

FIG. 1 depicts a magnetron sputtering system 10. Generally, the sputtering system is comprised of a vacuum chamber 12 defining a controlled environment; a cathode assembly 11 including a target 14 having one or more sputterable target materials; one or more power sources 16 supplying a cathodic charge and an anodic charge; and a gas distribution system 18.

Sputtering techniques and equipment utilized in magnetron sputtering systems are quite well known in the present art. For example, magnetron sputtering chambers and related equipment are available commercially from a variety of sources (e.g., Leybold and BOC Coating Technology). Examples of useful magnetron sputtering techniques and equipment are also disclosed in United States patents, such as U.S. Pat. No. 4,166,018, issued to Chapin, the entire teachings of which are incorporated herein by reference.

The magnetron sputtering process usually occurs within a controlled atmosphere vacuum chamber 12, which is depicted by phantom lines in FIG. 1. The vacuum chamber 12 generally includes metallic walls, typically made of steel or stainless steel, operably assembled to form a chamber that can accommodate a vacuum in which the sputtering process may occur.

As previously suggested, within or partially within chamber 12 is a cathode assembly 11. The cathode assembly 11 generally comprises one or more cylindrical targets 14, one or more motor assemblies 17, optional shield assemblies 19 and optional magnet assemblies (not shown). Cylindrical targets 14 are usually held in a manner suitable to allow rotation about its longitudinal axes. Although a cylindrical target is illustrated in FIG. 1, note that one or more planar targets with adjacent magnet assemblies may also be utilized in the present invention.

Figure 2:
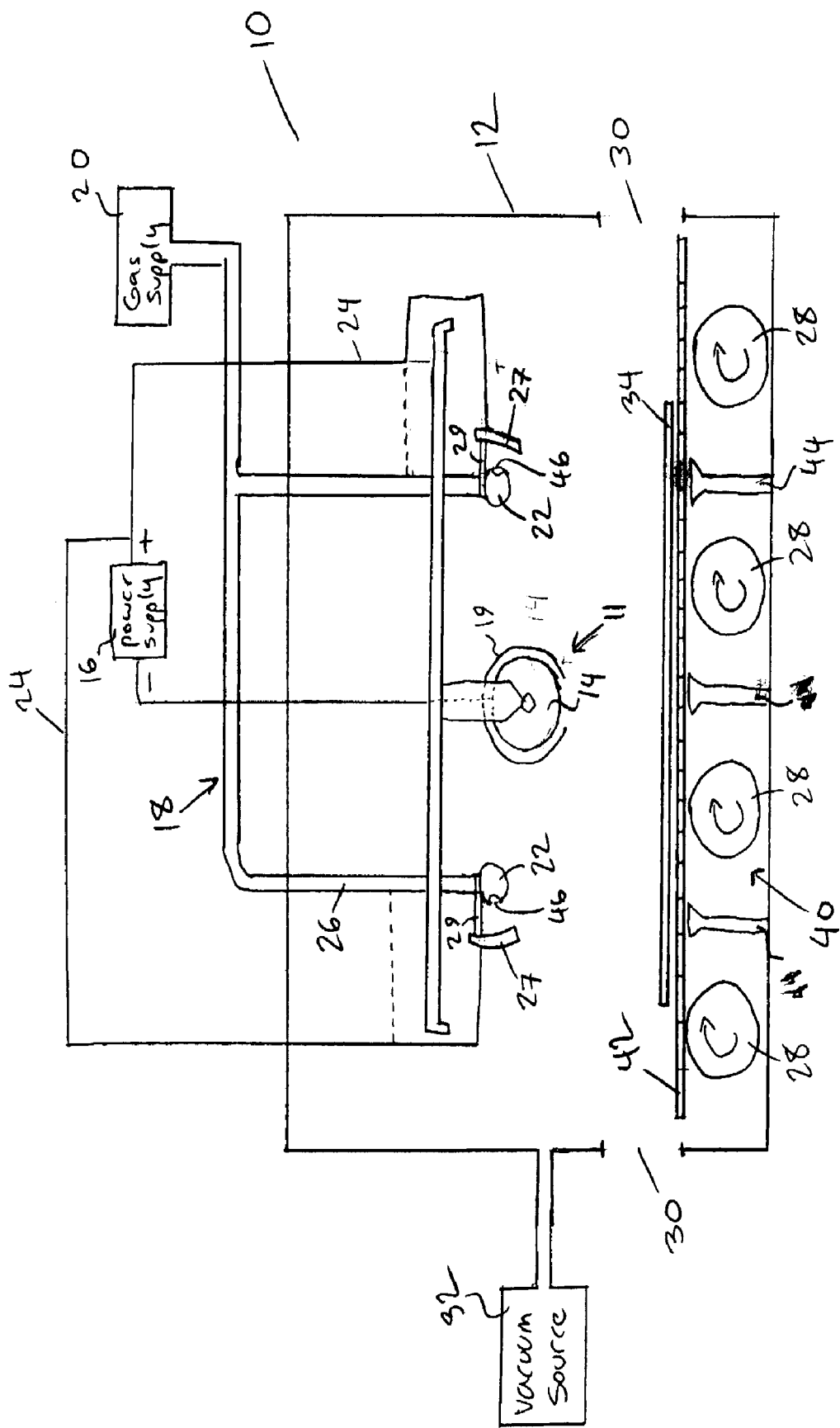
FIG. 2 is a side cross-section pictorial representation of a sputtering apparatus including an anodic gas distribution system having one or more gas delivery members operably connected to conductive members.

Generally, the cylindrical target 14 includes a tubular backing formed of electrically conductive material, such as stainless steel, aluminum or any other suitably conductive material. The outer surface of the cylindrical target 14 is normally coated with one or more target materials, which are intended to be sputtered onto a workpiece or substrate. This coating of sputterable target materials is also referred to herein as "target materials." Although only one cylindrical cathode assembly 11 is illustrated in FIGS. 1 and 2, use of two or more cylindrical cathode assemblies 11 within a single vacuum chamber 12 is contemplated. Sputterable target materials include, but are not limited to, materials such as silicon, zinc, tin, silver, gold, aluminum, copper, titanium, niobium or combinations thereof. The target materials may also be reacted with a reactive gas such as oxygen or nitrogen to form dielectric coatings, such as zinc oxide, silicon nitride or the like.

The cylindrical cathode assembly 11 further includes one or more motor assemblies 17 operably connected to each cylindrical target 14 by any clamping or bracketing means (not shown) known in the art. Such a clamping or bracketing device would not inhibit and would allow for the rotation of the cylindrical target 14 by the motor assembly 17. FIG. 1 depicts a cylindrical target 14 operably adjoined to multiple motors 38. The clamping or bracketing device may be any type of clamp, bracket, frame, fastener or support that keeps the cylindrical target assembly 11 in a stationary position and does not affect the rotation of the cylindrical target 14.

Each motor assembly 17 broadly includes one or more motors 38, a power source 16, and a control system 54. Commonly, one or more power sources 16 provide power to the motors 38 as well as a positive charge to the gas distribution system 18 and a negative charge to the cylindrical target 14. The power source may provide either direct current or alternating current. When alternating current is used, the 5–200 kilohertz range is preferred. Embodiments of the motor 38 of the present invention include but are not limited to programmable stepper motors, electric motors, hydraulic motors and/or pneumatic motors. The motor is operably adjoined to power source 16 and control system 54. The motor 38 is operably connected to the cylindrical target 14 so that when activated it rotates the cylindrical target 14. Of course, other types of motors and electronic control systems may be used without departing from the spirit or scope of the invention.

The motor 38 may be configured and/or programmed to optimize the efficient use of the cylindrical target 14 by rotating the target through the plasma generated in the magnetron sputtering system 10. For example, the motor assembly 17 may be programmed to produce changes in rotational speed to optimize the sputtering process and the life of the cylindrical target 14.

FIG. 2 further illustrates an embodiment of the present invention that includes a system of entry and exit for the substrate or workpiece, thereby allowing for constant operation of the vacuum chamber 12 for extensive periods of time. See the entry and exit doors 30 shown in FIG. 2. The substrate support system 40 is comprised of rollers 28, conveyor belt 42, and support bars 44. Substrate 34 rests upon conveyor belt 42 and is brought into deposition chamber 12 through door 30 by the rotation of rollers 28. The rollers 28 are maintained at a speed which allows for optimum application of the sputtering material. Support bars 44 function to add support between the rollers 28 and to prevent substrate 34 from sagging when between rollers 28. The substrate support system 40 allows for a continual deposition application. Once the substrate 34 has been coated, it exits the chamber 12 through an exit door 30.

Figure 3:
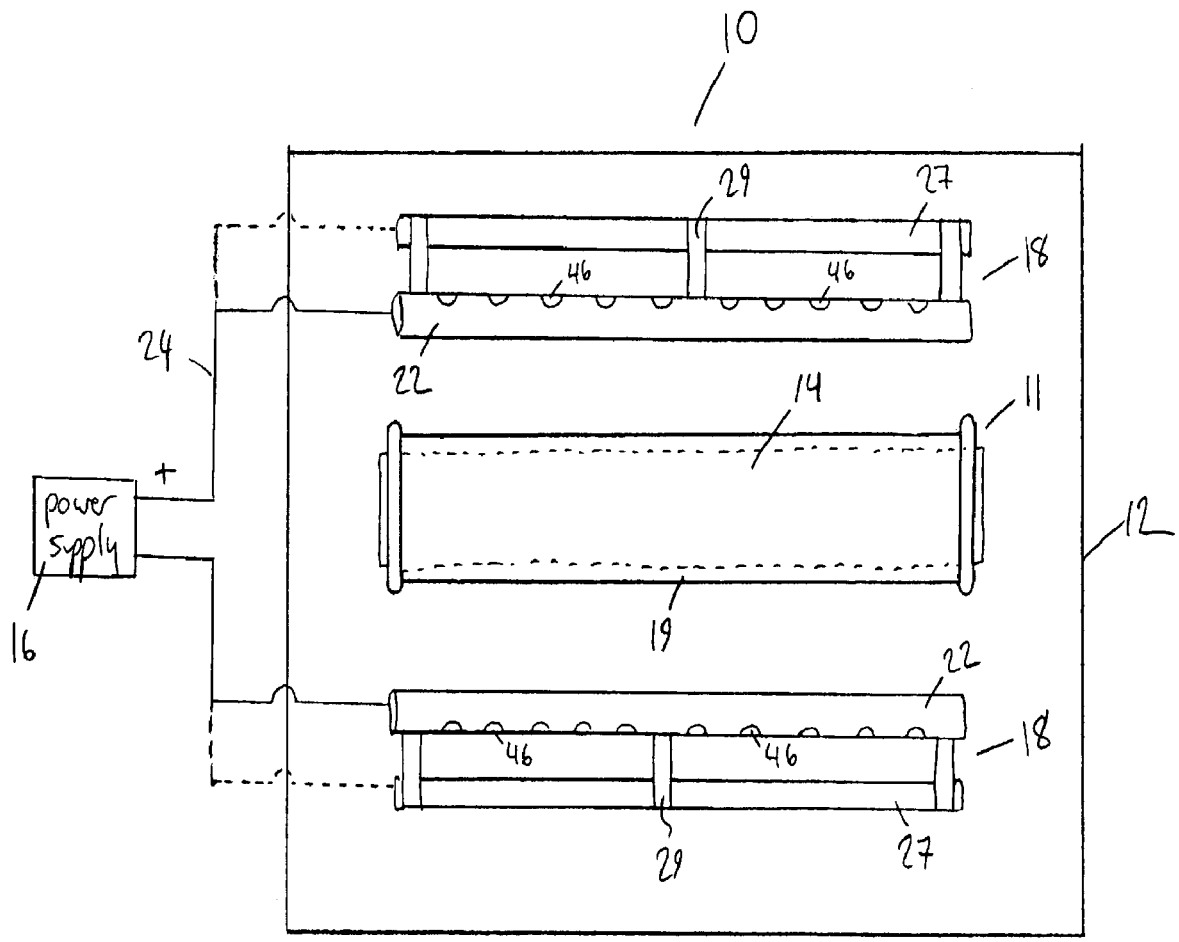
FIG. 3 is an elevational view of a cathode/target and an anodic gas distribution system.

Referring now to the embodiments depicted in FIGS. 1–3, the magnetron sputtering system 10 also includes a gas distribution system 18. The gas distribution system 18 generally includes one or more gas delivery members 22 through which one or more sputtering gases are introduced into the deposition chamber 12, a high current electric conductor line 24 operably connecting the power source 16 to the cathode assembly 11 and one or more other components of the gas distribution system 18, and a gas conduit 26 through which the sputtering gas is delivered from gas supply 20 to the gas delivery members 22. Examples of the gas delivery members include, but are not limited to, tubes, hollow shafts, ducts, hollow bars and hollow beams, all generally comprising a conductive material. In accordance with the present invention, electric conductor line 24 delivers a positive charge to the gas distribution system thereby creating an anodic surface that is positioned in sufficient proximity to the target 14. The positioning of the anodic surface in sufficient proximity to the cathode assembly 11 assists in maintaining stable plasma by stabilizing the zone of sputtering gas adjacent to the exterior surface of the target 14 (sputtering zone). Furthermore, the gas delivery members 22 and/or the anodic surface should remain substantially parallel to the cylindrical targets 14. For example, the anodic surface depicted in FIG. 1 is the surface of the gas delivery members 22, which are positioned substantially parallel to the cathode assembly 11. The precise symmetry between the gas delivery members 22 and/or anodic surfaces with the cylindrical targets 14 assists in providing uniform consumption of the cylindrical targets 14 and uniform coating thickness on the substrate 34 during the sputtering process.

In the sputtering process, after the initial preconditioning of the chamber 12, the gas supply 20 provides a supply of gas, usually inert gas, and preferably argon, through the gas conduit 26. The gas conduit 26 operatively connects the gas supply 20 to the gas delivery members 22 through which sputtering gas is introduced into deposition chamber 12. The delivery of sputtering gas is added to chamber 12 by passing through the gas delivery members 22 and out of a plurality of nozzles 46 positioned on the gas delivery members 22, as depicted in FIGS. 1–5. In one example, gas may be introduced to the deposition chamber 12 until a pressure of approximately 1–15 Pa is achieved. In order to maintain the chamber pressure of approximately 1–15 Pa in this example additional gas must be added over time. As depicted in FIG. 5, an insulator 31 may be added to the gas conduit 26 to prevent a discharge or surge of electrical energy through the gas conduit to the gas supply 20.

Furthermore, in one embodiment of the present invention, as depicted in FIG. 1, the electric conductor line 24 is operatively adjoined to the gas delivery members 22 to apply a positive charge directly to the gas delivery members 22. In this embodiment, the gas delivery members 22 themselves are conducting anodic surfaces. The gas delivery members 22 of this embodiment include nozzles 46 that are directed away from the target 14, thereby providing a more uniform distribution of sputtering gas. The positioning of the nozzles 46 directed away from the target also localizes the gas plasma proximate to the surface of target 14 without unduly displacing the plasma by a flow of gas. This in turn helps ensure a relatively uniform film deposited on substrate 34.

An alternative embodiment of the present invention, as depicted in FIGS. 2 and 3, illustrates gas delivery members 22 operably adjoined to a conductive member 27 by brackets 29. The conductive member 27 may be comprised of stainless steel, aluminum or any other suitably conductive material. In this embodiment, the gas delivery members 22 are positioned so as to direct the gas distribution nozzles 46 at the conductive member 27. Such positioning generally directs gas at the conductive member 27 thereby facilitating the production of a plasma flame or gas flow, which contacts the conductive member 27. The plasma flame or gas flow provides a cleaning function, which maintains a conductive surface on the conductive member 27 and thereby prevents or diminishes the deposition of nonconductive target material on the conductive member 27. The maintaining of such conductive surfaces assists in the maintenance of a stable plasma. The brackets 29 adjoining the gas delivery members 22 to the conductive members 27 may include conductive or nonconductive material depending upon whether it is desirable to deliver a positive charge to the gas delivery members 22. In one embodiment, an anodic conducting surface is generated apart from the gas delivery member 22 and on the conductive members 27 by adjoining the conductive members 27 to the electric conductor line 24. In this embodiment, the conductive members 27 are adjoined to the gas delivery members 22 by brackets 29 comprising a nonconductive material. The nonconductive material may include any type of ceramic or other suitable insulative material.

Referring to FIGS. 1–3, the electric conductor line 24 normally provides a positive electrical current to the periphery of the conductive members 27, gas conduits 26 and/or the gas delivery members 22. When the electric conductor line 24 is operably connected to the gas conduits 26 or gas delivery members 22, the flow of sputtering gas is directed to flow over an exposed, electrically conductive surface of the gas delivery member 22 immediately adjacent to the apertures 46. The flow of sputtering gas tends to clear the area surrounding the nozzle 46 from build-up of undesirable target material thereby maintaining a conductive anodic surface. Hence, as stated above, the gas delivery member 22 may be an anodic conducting surface, operably coupled to gas conduit 26 and electrically coupled to the electric conductor line 24 thereby delivering power from power supply 16.

Alternatively, the electric conductor line 24 may electrically couple the power supply to the conductive member 27 which is separated from the gas delivery member 22 by conductive or nonconductive brackets 29. Nonconductive brackets may be utilized if it is desired to isolate the gas delivery members 22 from an electric charge. As previously mentioned, in either embodiment the gas flow from the gas member 22 is generally directed toward the conductive member 27 thereby maintaining anodic conducting surfaces on the gas member 22 and/or the conductive member 27. Finally, it is generally noted that in many embodiments of the present invention the power supply may provide a potential of approximately 0.1–5 kV with a current equal to at least 0.1–10 mA/cm$^2$ of the target surface area. However, this potential may vary depending upon the specifications of the magnetron sputtering system and other factors including, but not limited to sputtering material properties and sputtering rates.

Figure 4:
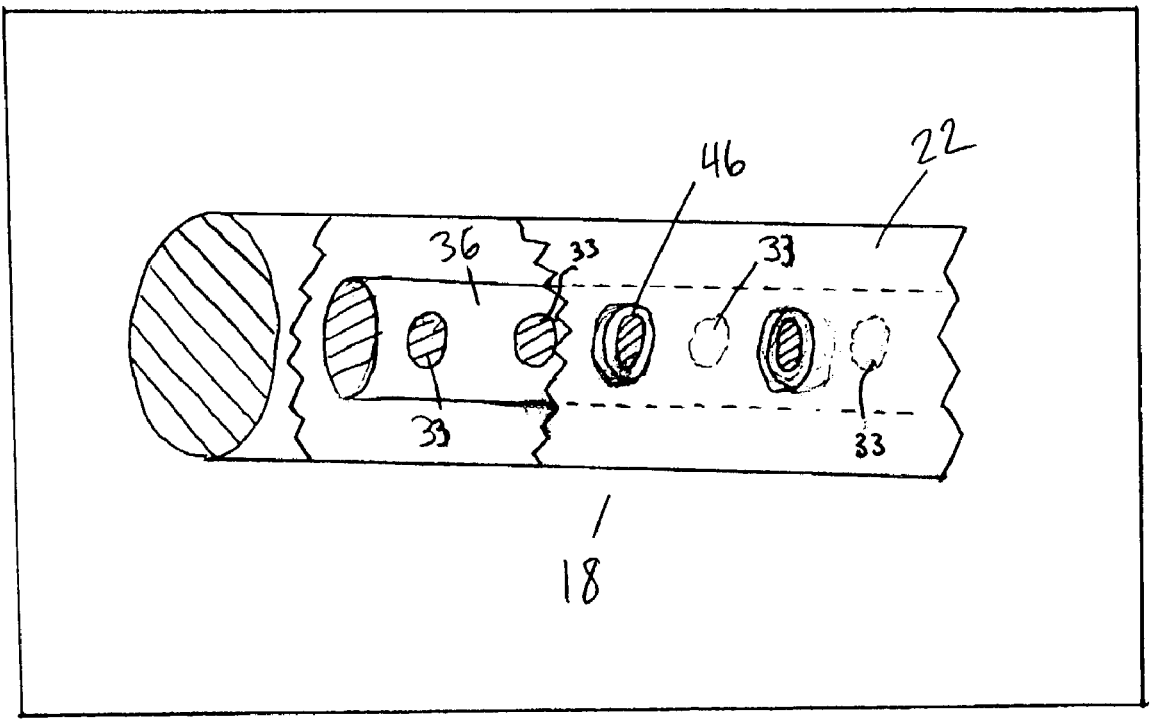
FIG. 4 is a perspective view of one embodiment of an anodic gas distribution system of the present invention.
Figure 5:
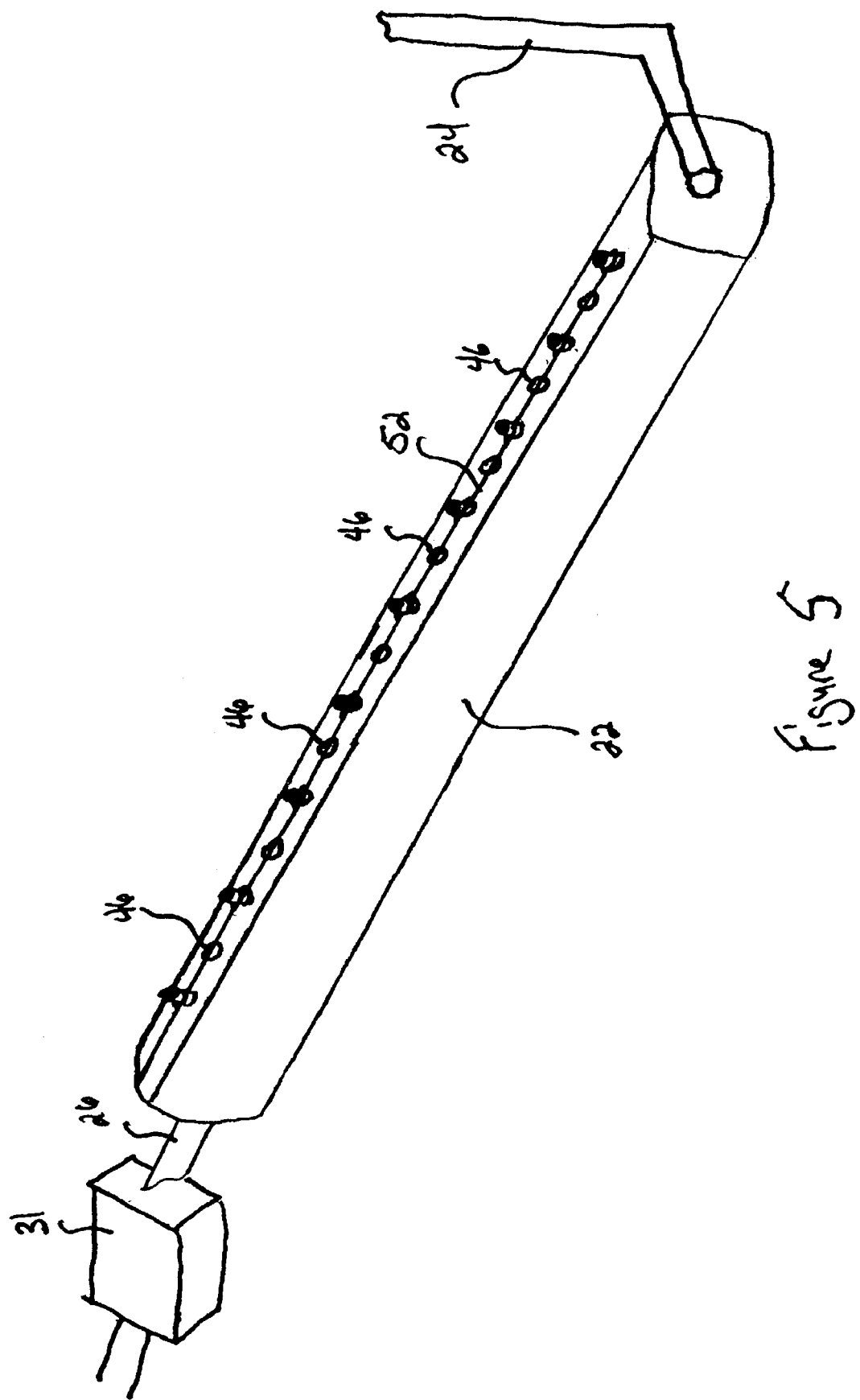
FIG. 5 is a perspective view of an anodic gas distribution system including a conductive wire and an insulator.

FIG. 4 illustrates another embodiment of the gas distribution system 18 of the present invention wherein the gas distribution system 18 includes inner conduits 36 positioned within the gas delivery members 22. In this embodiment, gas supply 20 is connected to the inner conduit 36. Inner conduit 36 can be made of any suitable material used in distributing gas, such as steel, aluminum or stainless steel, and normally is dimensioned such that it can be placed inside a gas delivery member 22. Inner conduit 36 includes a plurality of apertures 33 that are spaced and aligned apart from nozzles 46 of the gas delivery member 22. For example, the apertures 33 may be positioned to face away from the nozzles 46 or staggered in between two or more nozzles 46 of the gas delivery member 22 as shown in FIG. 4. Either configuration, or variants of those configurations, prevents the direct flow of gas from the apertures 33 through the nozzles 46. Thus, as gas is distributed from gas supply 20 through inner conduit 36, the gas will flow through apertures 33 and into the gas delivery member 22. As the gas enters gas delivery member 22, it will diffuse, thereby evenly filling the gas delivery member 22. The gas that is contained in the gas delivery member 22 will subsequently egress through the gas nozzles 46 and into the chamber 12. By evenly filling the gas delivery member 22 and preventing the direct flow of gas along a jet, this embodiment more evenly distributes gas into chamber 12, which provides a more stable plasma and enhances the sputtering process.

In another embodiment of the present invention, as depicted in FIG. 5, the conductive members 27 may include one or more conductive wires 52, such as tungsten wires, that are suspended in front of the gas distribution nozzles 46. In this embodiment of the present invention, the gas delivery members 22 and attached conductive wires 52 are operably adjoined to the electric conductor line 24. The flow of sputtering gas through nozzles 46 of the gas delivery members 22 generally generates a plasma flame that passes over the conductive wire 52. The flow of sputtering gas and/or the presence of a plasma flame assure that an exposed, conductive anodic surface is maintained on wire 52 during prolonged sputtering of the target. The maintenance of an exposed anodic surface is beneficial in sustaining a stable plasma and preventing the potential of plasma discharge through the gas delivery members 22 to the electrical connection 24. It is important to note that an insulator 31

(depicted in FIG. 5) is located between gas conduit 26 and gas supply 20. The insulator 31 prevents current from flowing from a gas conduit 26 to the gas supply 20, causing a meltdown at the joint where the two meet.

Figure 6:
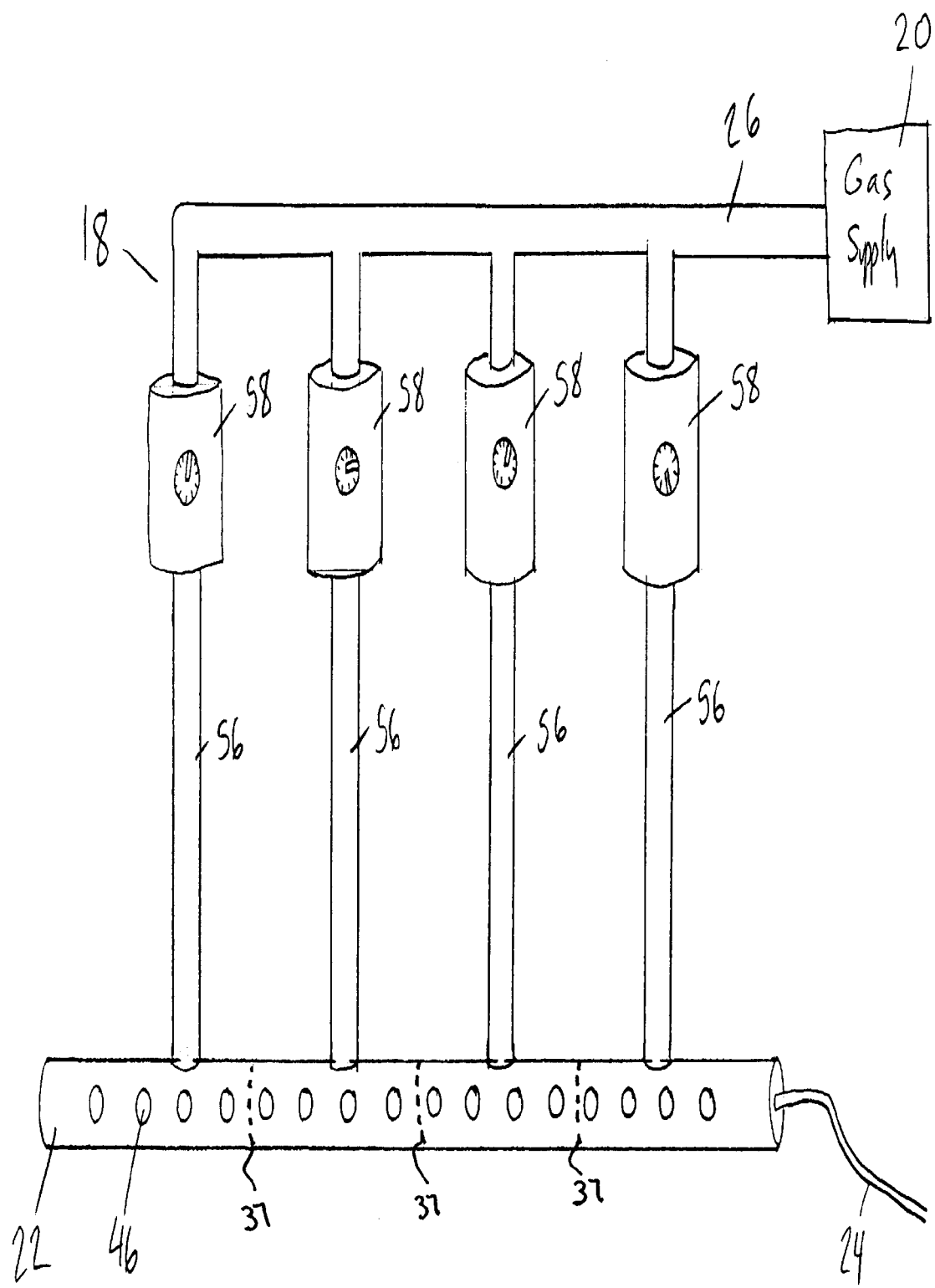
FIG. 6 is a pictorial representation of an anodic gas distribution system with a plurality of flow control devices for locally controlling gas discharge.

In an additional embodiment of the present invention shown in FIG. 6, the gas distribution system 18 comprises a plurality of independent gas lines 56 connected to the gas delivery member 22. These independent gas lines 56 are each governed by a gas flow control device 58, which is insulated to prevent current flowing back to the gas supply 20, as described above. The gas flow control devices 58 independently control the rate of gas flow through each of the independent gas lines 56 in order to switchably control the plasma discharge by varying the gas flow at specific locations along the gas delivery member 22. In one embodiment of the present invention the gas flow control device 58 comprises a valve that is adjusted by manually or by automated means thereby controlling the amount of gas that passes through each independent gas line 56. In this embodiment, the gas flow can be adjusted to intermittently pulse in order to control the shape of the plasma and/or the consumption of various parts of the target. Finally, the gas delivery member 22 may include one or more partitions 37, as depicted by the dashed lines in FIG. 6, to further control the flow of gas from each independent line 56 into the chamber 12.

In operation, the magnetron sputtering system 10 can be used to deposit one or more coatings upon one or more substrates 34 by sputtering target material from the cylindrical cathode assembly 11. The process is generally initiated by pumping down or evacuating deposition chamber 12. Normally, the chamber 12 is pumped down to approximately $10^{-5}$ Pa or less. This operation preconditions the chamber 12 by removing contaminants before the sputter deposition. Next, an inert gas, typically argon, is inserted into chamber 12 through the gas delivery system 18, gradually increasing the pressure of the chamber to approximately 1–15 Pa (8–113 mTorr). Normally, in order to maintain a suitable gas pressure of a desired gas composition and to flush out contaminants in sputtering chamber 12, a steady flow of clean argon gas is added over time. The gas may be added to chamber 12 by a plurality of gas distribution systems 18, which are spaced at strategic locations within sputtering chamber 12. This helps ensure a uniform gas composition and distribution across the surface of target 14. This, in turn, helps ensure a relatively uniform film is deposited on substrate 34, free from any visible variations in thickness or composition.

As previously suggested, vacuum chamber 12 of the present invention is adapted to maintain a controlled environment, e.g., temperature, pressure, and vacuum. That is to say chamber 12 is a plenum chamber; a compartment in which the interior air pressure is higher than the exterior air pressure. Gas is generally forced into chamber 12 and then slowly exhausted through an exhaust port 32. FIG. 3 depicts an embodiment of the present invention wherein the exhaust port 32 is present in the side wall of chamber 12. A vacuum source 35 is connected to exhaust port 32 to evacuate chamber 12 and maintain the interior of chamber 12 at the appropriate vacuum level. Preferably, deposition chamber 12 includes external ducts (not shown) to circulate a coolant (e.g., liquid coolant) in order to maintain the internal temperature of the chamber and minimize outgassing of the walls during sputter deposition.

Once gas has been introduced to the chamber 12 the power source is initiated to administer a positive charge to the gas delivery system 18 and a negative charge to the cylindrical target 14. As previously mentioned, the administration of charge to the cathode and anode generates a plasma, which facilitates the sputtering of target material from the target 14 to the substrate 34. Generally, the substrate 34 is passed through the chamber 12 by the substrate support system 40 at a predetermined rate. The rate may be adjusted to provide the desired exposure to sputtered target material, thereby forming the preferred coating thickness.

During the sputtering process, gas passes through the gas delivery members 22 and through the nozzles 46. The entry of gas through the nozzles and into the plasma usually generates a plasma flame due to the positioning of the plasma between the gas distribution system 18 and the cathode assembly 11. As previously mentioned, the plasma flame or gas flow maintains clean anodic surfaces on portions of the gas distribution system 18, such as the surface around the nozzles, the surface of the conductive member 27 and/or the surface of the conductive wire 52.

It is important to note that the amount of material sputtered is inversely proportional to the gas pressure and distance between the anode and cathode. This is true for an increase in pressure because at high pressures ($p \geq 7$ Pa), the ions become compressed and thus frequently collide with neutral atoms; therefore, fewer ions arrive at target 14 with energy enough to liberate surface atoms on the target surface. Some of the atoms that are liberated will also collide with the large number of gas atoms and thus lose energy. Consequently, the sputtering yield and the deposition rates are reduced. The anode to cathode spacing is also a very important parameter because of the cathodes role as a source of electrons and sputtered atoms. Preferably, the substrate is placed as close to the target as possible to maximize the deposition rate. In practice, the general distance between target 14 and substrate 34 is about 1 to 10 cm, which provides for a high deposition rate. The distance can be modified depending upon the voltage maintained between the cathode and anode.

It will be appreciated that the present invention can take many forms and embodiments. The true essence and spirit of this invention are defined in the appended claims, and it is not intended that the embodiment of the invention presented herein should limit the scope thereof.

What is claimed is:

1. A magnetron sputtering apparatus for applying thin films on substrates, comprising:
   a vacuum chamber within which a controlled environment may be established;
   one or more cathode assemblies including a target comprising one or more sputterable target materials;
   a gas distribution system operatively connected to one or more gas supplies and including one or more gas delivery members each being hollow and each having nozzles through which sputtering gases are introduced into the vacuum chamber;
   and one or more power supplies electrically connected to the one or more cathode assemblies and the gas distribution system.

2. The magnetron sputtering apparatus of claim 1 wherein the one or more power supplies are directly connected to a gas conduit or the one or more gas delivery members to deliver a positive charge to said one or more gas delivery members.

3. The magnetron sputtering system of claim 1 wherein the gas distribution system further compnses one or more inner conduits positioned within the one or more gas delivery members.

4. The magnetron sputtering apparatus of claim 3 wherein the one or more inner conduits include a plurality of apertures that are spaced and aligned in a non-overlapping manner relative to the nozzles.

5. The magnetron sputtering apparatus of claim 1 wherein a power source is operatively connected to one or more conductive members that are positioned adjacent to the one or more gas delivery members.

6. The magnetron sputtering apparatus of claim 5 wherein the one or more conductive members are attached to the one or more gas delivery members by non-conductive brackets.

7. The magnetron sputtering apparatus of claim 5 wherein the conductive members include one or more conductive wires.

8. The magnetron sputtering apparatus of claim 1 wherein the gas delivery nozzles face away from the one or more cathode assemblies.

9. The magnetron sputtering apparatus of claim 1 wherein an insulator is interposed between the one or more gas supplies and the one or more gas delivery members.

10. The magnetron sputtering apparatus of claim 1 wherein a plurality of independent gas lines including gas flow controllers operably connect the one or more gas delivery members to the one or more gas supplies.

11. The magnetron sputtering apparatus of claim 10 wherein the one or more gas delivery members include one or more partitions to contain the flow of gas from the independent gas lines in predesignated portions of the one or more gas delivery members.

12. An anodic gas delivery system comprising:
one or more gas delivery members conducively coupled to a power supply to produce at least one anodic surface, the one or more gas delivery members each being hollow and each including nozzles through which one or more sputtering gases are introduced into a deposition chamber;
and a gas conduit through which the sputtering gases are delivered from one or more gas supplies to the one or more gas delivery members.

13. The anodic gas delivery system of claim 12 wherein the anodic gas delivery system further includes one or more inner conduits positioned within the one or more gas delivery members.

14. The anodic gas delivery system of claim 13 wherein the inner conduits include a plurality of apertures that are spaced and aligned in a non-overlapping manner relative to the nozzles.

15. The anodic gas delivery system of claim 12 wherein the one or more sputtering gas is directed to flow away from a cathode assembly.

16. The anodic gas delivery system of claim 12 wherein an insulator is interposed between the one or more gas supplies and the one or more gas delivery members.

17. The anodic gas delivery system of claim 12 wherein gas flow from the one or more gas delivery members may be locally varied by using a plurality of independent gas lines including gas flow controllers operably connecting the one or more gas delivery members to the gas supply.

18. The anodic gas delivery system of claim 17 wherein the gas delivery member includes one or more partitions to contain the flow of gas from the independent gas lines in predesignated portions of the one or more gas delivery members.

19. An anodic gas delivery system comprising:
one or more gas delivery members each being hollow and each including nozzles through which one or more sputtering gases are introduced into a deposition chamber;
one or more conductive members positioned adjacent to the one or more gas delivery members so as to receive a flow of gas from the one or more gas delivery members and electrically coupled to a power supply to produce at least one anodic surface on the conductive members;
one or more brackets operably adjoined to the one or more conductive members to deliver a charge to the one or more gas delivery members;
and a gas conduit through which the one or more sputtering gases are delivered from one or more gas supplies to the one or more gas delivery members.

20. The anodic gas delivery system of claim 19 wherein the anodic gas delivery system further includes one or more inner conduits positioned within the one or more gas delivery members.

21. The anodic gas delivery system of claim 20 wherein the one or more inner conduits include a plurality of apertures that are spaced and aligned in a non-overlapping manner relative to the nozzles.

22. The anodic gas delivery system of claim 19 wherein the one or more sputtering gases is directed to flow away from cathode assemblies.

23. The anodic gas delivery system of claim 19 wherein an insulator is interposed between the one or more gas supplies and the one or more gas delivery members.

24. The anodic gas delivery system of claim 19 wherein gas flow from the one or more gas delivery members may be locally varied by using a plurality of independent gas lines including gas flow controllers operably connecting the one or more gas delivery members to the one or more gas supplies.

25. The anodic gas delivery system of claim 24 wherein the one or more gas delivery members includes one or more partitions to contain the flow of gas from the independent gas lines in predesignated portions of the one or more gas delivery members.

26. The anodic gas delivery system of claim 19 wherein the one or more conductive members is a conductive wire.

27. The anodic gas delivery system of claim 19 wherein the one or more sputtering gases is directed to flow away from cathode assemblies.

28. The anodic gas delivery system of claim 19 wherein the one or more conductive members are adjoined to the one or more gas delivery members with non-conductive brackets.

29. A method of maintaining a conductive anodic surface in a magnetron sputtering system comprising: introducing one or more gases through at a gas delivery system and into a deposition chamber, said gas delivery system including one or more gas delivery members each being hollow and each having nozzles through which the one or more sputtering gases are introduced into the deposition chamber and one or more gas conduits operatively connecting the one or more gas delivery members to one or more gas supplies;
administering a negative charge to a cathode assembly including a target having one or more target materials and a positive charge to the gas delivery system using one or more power sources to generate a sputtering plasma for applying target material from said target to a substrate.

30. The method of maintaining a conductive anodic surface of claim 29 wherein the one or more power sources are directly connected to the one or more gas delivery members to deliver a positive charge to said one or more gas delivery members.

31. The method of maintaining a conductive anodic surface of claim 29 wherein the gas distribution system further includes one or more inner conduits positioned within the one or more gas delivery members.

32. The method of maintaining a conductive anodic surface of claim 31 wherein the one or more inner conduits include a plurality of apertures that are spaced and aligned in a non-overlapping manner relative to the nozzles.

33. The method of maintaining a conductive anodic surface of claim 29 wherein the one or more power sources are operatively connected to one or more conductive members that are attached to the one or more gas delivery members.

34. The method of maintaining a conductive anodic surface of claim 33 wherein the one or more conductive members are attached to the one or more gas delivery members by non-conductive brackets.

35. The method of maintaining a conducting anodic surface of claim 33 wherein the one or more conductive members are conductive wires.

36. A method of maintaining a stable plasma in a magnetron sputtering system comprising the steps of:
introducing one or more sputtering gases through a gas delivery system and into a deposition chamber, the gas delivery system including one or more gas delivery members each being hollow and each having nozzles through which the one or more sputtering gases are introduced into the deposition chamber;
administering a negative charge to a cathode assembly and a positive charge to the gas delivery system using one or more power sources; and
maintaining the conductive capacity of the gas delivery system through the cleaning action of the plasma flame and/or directed gas flow.

37. The method of maintaining a stable plasma of claim 36 wherein the gas delivery system includes one or more gas conduits operatively connecting the one or more gas delivery members to one or more gas supplies.

38. The method of maintaining a stable plasma of claim 37 wherein the one or more power sources are directly connected to the one or more gas conduits or the one or more gas delivery members to deliver a positive charge to said one or more gas delivery members.

39. The method of maintaining a stable plasma of claim 36 wherein the gas distribution system further comprises one or more inner conduits positioned within the one or more gas delivery members.

40. The method of maintaining a stable plasma of claim 39 wherein the one or more inner conduits include a plurality of apertures that are spaced and aligned in a non-overlapping manner relative to the nozzles.

41. The method of maintaining a stable plasma of claim 36 wherein the one or more power sources is operatively connected to one or more conductive members that are positioned adjacent to the gas delivery members.

42. The method of maintaining a stable plasma of claim 41 wherein the one or more conductive members are attached to the one or more gas delivery members by brackets.

43. The method of maintaining a stable plasma of claim 41 wherein the one or more conductive members include one or more conductive wires.

44. The method of maintaining a stable plasma of claim 36 wherein the nozzles face away from cathode assemblies.

45. The method of maintaining a stable plasma of claim 37 wherein an insulator is interposed between the one or more gas supplies and the one or more gas delivery members.

46. The method of maintaining a stable plasma of claim 37 wherein a plurality of independent gas lines including gas flow controllers operably connect the one or more gas delivery members to the one or more gas supplies.

47. The method of maintaining a stable plasma of claim 46 wherein the one or more gas delivery members include one or more partitions to contain the flow of gas from the independent gas lines in predesignated portions of the one or more gas delivery members.

48. The anodic gas delivery system of claim 42, wherein the one or more brackets operably adjoined to the one or more conductive members is made from a nonconductive material.

49. The method of maintaining a conductive anodic surface of claim 29 wherein an insulator is interposed between the one or more gas supplies and the one or more gas delivery members.

* * * * *